United States Patent [19]

Thomas et al.

[11] Patent Number: 4,682,409
[45] Date of Patent: Jul. 28, 1987

[54] FAST BIPOLAR TRANSISTOR FOR INTEGRATED CIRCUIT STRUCTURE AND METHOD FOR FORMING SAME

[75] Inventors: Mammen Thomas, San Jose; Matthew Weinberg, Mountain View, both of Calif.

[73] Assignee: Advanced Micro Devices, Inc., Sunnyvale, Calif.

[21] Appl. No.: 747,517

[22] Filed: Jun. 21, 1985

[51] Int. Cl.⁴ .............................................. H01L 21/28
[52] U.S. Cl. .................................... 29/591; 29/576 B; 29/576 W; 148/DIG. 11; 148/DIG. 19; 148/1.5; 156/643
[58] Field of Search .................... 29/571, 576 W, 591, 29/576 B; 148/1.5, DIG. 11, DIG. 19; 156/643; 357/23.1, 43, 47, 67; 427/88

[56] References Cited

U.S. PATENT DOCUMENTS 4,259,680 3/1981 Lepselter et al. ..................... 357/67
4,486,942 12/1984 Hirao ................................. 29/571

FOREIGN PATENT DOCUMENTS 139266 5/1985 European Pat. Off. ............. 357/43

Primary Examiner—Brian E. Hearn
Assistant Examiner—Kevin McAndrews
Attorney, Agent, or Firm—Patrick T. King; John P. Taylor; J. Vincent Tortolano

[57] ABSTRACT

An improved bipolar device is disclosed having a polysilicon emitter formed over a base region of a silicon substrate with oxide spacer portions formed on the sides of the emitter and metal silicide portions formed over the base region adjacent the oxide spacers whereby the use of polysilicon for the emitter results in high gain as well as vertical shrinking of the device because of the shallow diffusion of the emitter into the base and the elimination of an extrinsic base region. The use of oxide spacers and metal silicide adjacent the spacers results in a shrinkage of the horizontal spacing of the device to lower the base-emitter resistance and capacitance to thereby increase the speed of the device.

7 Claims, 8 Drawing Figures

FAST BIPOLAR TRANSISTOR FOR INTEGRATED CIRCUIT STRUCTURE AND METHOD FOR FORMING SAME

BACKGROUND OF THE INVENTION

1. Field of the Invention

This invention relates to the production of a bipolar transistor for an integrated circuit structure. More particularly, this invention relates to the production of a fast bipolar transistor using a polysilicon emitter isolated from an adjoining metal silicide base contact by oxide spacers.

2. Description of the Prior Art

Spacing between the emitter and the base contact in prior art bipolar transistors is defined by lithography and isolated by oxide. This makes it necessary to have a high dose implanted extrinsic base region under the oxide which acts as the interconnect between the intrinsic base and the base contact. This high doping of the extrinsic base region results in unacceptable increases in capacitance between the base and the buried collector. This problem becomes particularly acute when the thickness of the epitaxial layer between the base and the buried collector is reduced for improved performance which results in the base butting against the buried collector layer to thereby raise the capacitance and slow down the speed of the device.

Furthermore, since the resistance of the doped extrinsic base region still does not approach the conductivity of polysilicon or metal, the minimum base resistance of the extrinsic base region, i.e., the resistance of the extrinsic base between the intrinsic base and the base contact, is always a factor degrading performance of such a device.

Another problem in prior art devices which adversely impacted the speed of such devices was the side diffusion of the highly doped extrinsic base into the emitter which reduced the emitter area and thereby prevented shrinking of the emitter area which would other wise be desirable to improve performance of the device by reducing the capacitance between the emitter and the intrinsic base beneath the emitter. Furthermore, in conventional emitter construction, sidewall capacitance cannot be reduced to gain performance improvement.

Conventional construction of single crystal emitters further limits the gain of the device as well as reducing the ability to provide a shallow emitter without incurring problems of reverse injection of carriers from base to emitter.

It would therefore be desirable to provide an improved bipolar device characterized by high gain, fast operation and low capacitance without encountering the above discussed problems.

SUMMARY OF THE INVENTION

It is therefore an object of this invention to provide an improved bipolar device characterized by fast operation and low capacitance and a method of making same.

It is another object of this invention to provide an improved high gain bipolar device having an emitter made using polysilicon with self-aligned contacts.

It is yet another object of this invention to provide an improved bipolar device having improved speed by providing a metal silicide layer over a portion of the base to lower the resistance between the intrinsic base and the base contact.

It is a further object of this invention to provide an improved bipolar device having oxide spacers formed adjacent the sidewall of the emitter to separate the emitter from the metal silicide base contact.

It is yet a further object of this invention to provide an improved bipolar device using planarization techniques to provide separate contacts to the emitter and the metal silicide base region.

It is a still further object of this invention to provide an improved bipolar device having a raised polysilicon base contact which may be opened simultaneously with the opening of the emitter and collector contacts to eliminate a step to the base contact.

These and other objects of the invention will become apparent from the following description and accompanying drawings.

In accordance with the invention, an improved bipolar device is provided having a polysilicon emitter formed over a base region of a silicon substrate with oxide spacer portions formed on the sides of the emitter and metal silicide portions formed over the base region adjacent the oxide spacers whereby the use of polysilicon for the emitter results in high gain as well as vertical shrinking of the device because of the shallow diffusion of the emitter into the base and the elimination of the extrinsic base. The use of oxide spacers and metal silicide adjacent the spacers results in a shrinkage of the horizontal spacing of the device to lower the base-emitter resistance without raising the capacitance to thereby increase the speed of the device.

DESCRIPTION OF THE INVENTION

The invention provides an improved bipolar transistor which may be termed a Base-Emitter-Spacer-Transistor or "BEST" because of the positioning of an oxide spacer between a raised polysilicon emitter and the base contact of the transistor.

Figure 1:
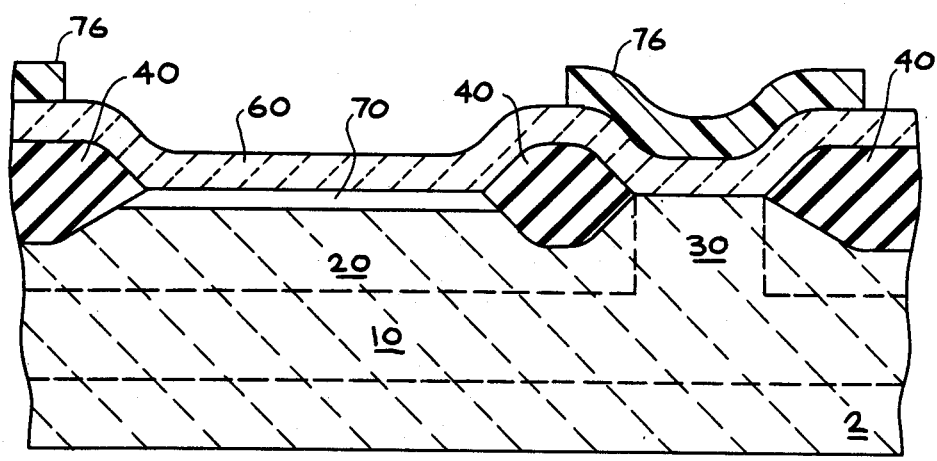
FIG. 1 is a fragmentary vertical cross-sectional view of an integrated circuit structure illustrating one stage of the construction of the improved bipolar device of the invention.

Referring now to FIG. 1, a buried collector 10 is shown as already formed in silicon substrate 2 with an epitaxial silicon layer 20 grown over buried collector 10. A sinker area 30 is masked and implanted to provide contact to buried collector 10. Oxide isolation areas 40, to separate the base contact from the collector contact—or to separate adjacent devices, are then grown or deposited followed by deposition of a 3000-5000 angstrom polysilicon layer 60 from which will eventually be formed the raised portion of the emitter for the bipolar transistor to be formed.

As shown in FIG. 1, polysilicon layer 60 may be masked with photoresist 76 to permit formation of an intrinsic base region 70 in epitaxial layer 20 by P+ implantation, e.g. with boron through the polysilicon. Preferably, however, the intrinsic base region is formed by implantation prior to deposition of polysilicon layer 60 to provide more accurate control of the depth of the base region to thereby permit thinning of the epitaxial layer and resultant vertical shrinking of the device without raising the base-collector capacitance.

Figure 2:
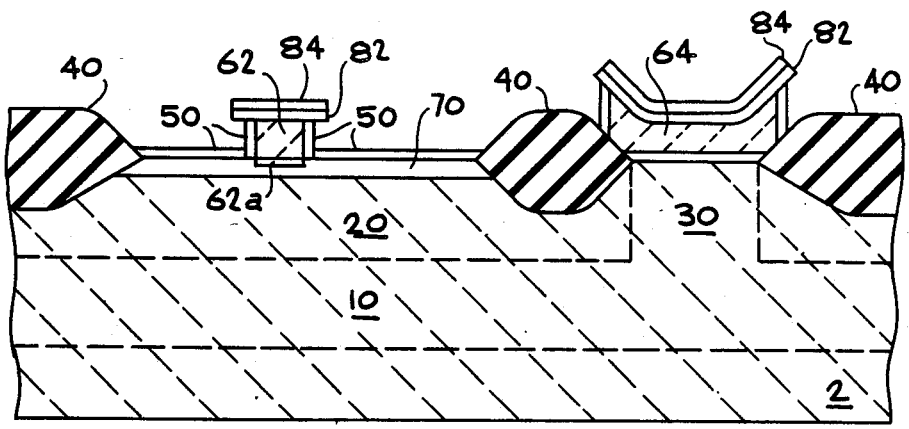
FIGS. 2-5 are fragmentary vertical cross-sectional views of an integrated circuit structure illustrating subsequent stages of the construction of the improved bipolar device of the invention.

Polysilicon layer 60 is doped with an N dopant, such as arsenic, phosphorus, or antimony to form an N+ layer from which is formed, in one embodiment, a raised emitter region 62 and a collector contact region 64. As shown in FIG. 2, emitter region 62 and collector contact region 64 are defined in the doped polysilicon layer 60 by masking with nitride layer 82 and an oxide layer 84 and etching away the remainder of polysilicon layer 60. Alternatively, oxide mask layer 84 may be replaced by a photoresist mask to define the emitter and collector regions.

After emitter region 62 and collector contact region 64 are formed, the oxide mask layer 84 (or the photoresist—if a photoresist mask is used) may be stripped away and nitride layer 82 used as a mask to grow a thin protective oxide layer 50 to prevent contamination of the polysilicon sidewalls prior to subsequent oxide deposition as will be described. The heat used in growing the thin oxide protective coating, i.e., about 900° C. for 20 minutes, is just sufficient to start to diffuse the doped polysilicon emitter region 62 into the underlying epitaxial silicon layer 20 to form the desired shallow emitter portion 62a in substrate 20.

The term "shallow emitter", as used herein, is intended to define an emitter which is diffused into the intrinsic base region of the epitaxial silicon layer to a depth of less than about 1000 angstroms, and preferably to a depth of about 800 angstroms, as opposed to the conventional 2400–3000 angstrom depth of prior art emitters.

Figure 3:
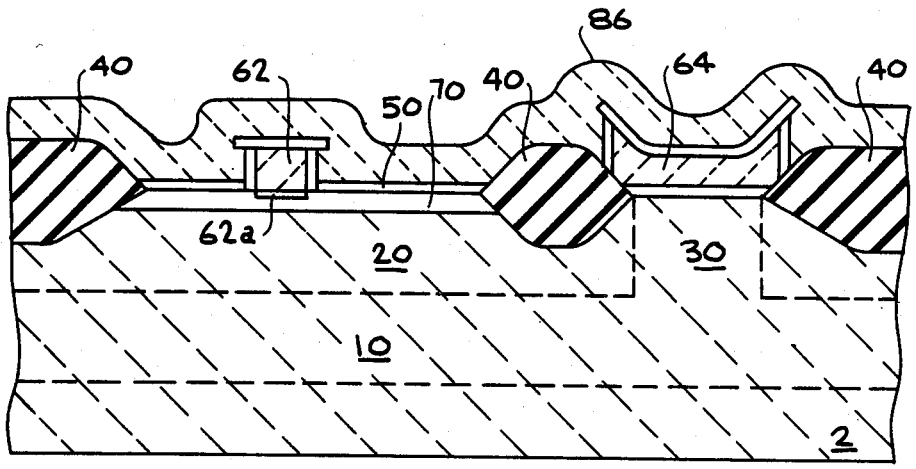
Figure 4:
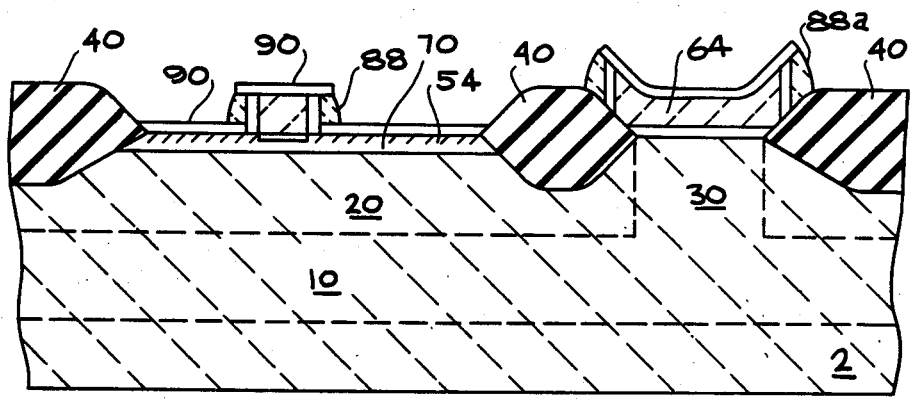
Figure 5:
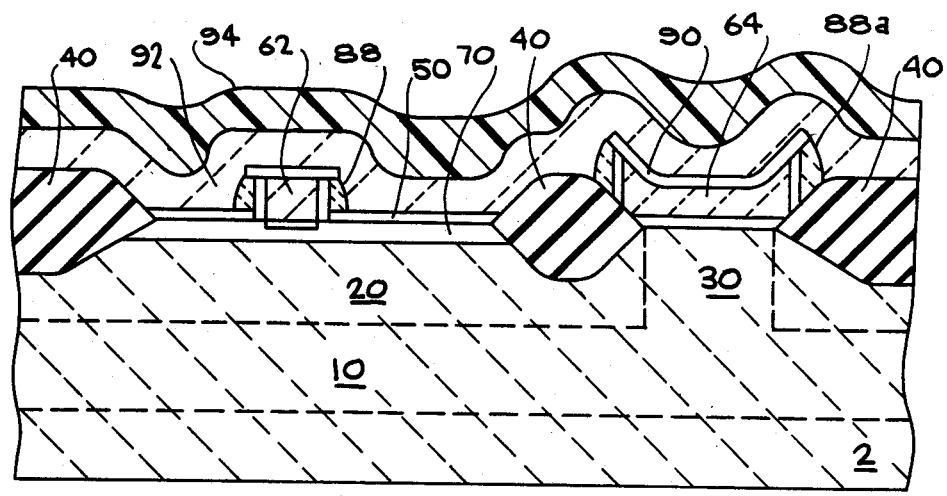

After growing protective oxide layer 50 and diffusing emitter 62 into epitaxial layer 20, an undoped oxide layer 86 is deposited over the structure as shown in FIG. 3. It should be noted that oxide layer 86 is not grown since the heat would over diffuse the emitter into the epitaxial silicon base region beneath emitter 62. After deposition of oxide layer 86, most of the oxide layer is removed using a reactive ion etch leaving only oxide spacer 88 on the sidewall of emitter region 62 and oxide spacer 88a on the side of collector contact 64 as shown in FIG. 4. Spacers 88 and 88a comprise oxide layers having a thickness or horizontal width of about 2500 to 5000 angstroms.

A further shallow, but high dosage, base implant is then performed by BF$_2$+ or Boron to provide a low resistance layer or path 54 on the surface of epitaxial silicon layer 20 as well as to provide a good contact to the metal silicide layer to be formed thereover. Nitride layer 82 is then stripped from emitter 62 and collector region 64 in preparation for formation of the silicide layer.

To form metal silicide layer 90, a metal such as, for example, platinum or titanium, is sputtered over the structure and then heated sufficiently to form a metal silicide, e.g., platinum silicide, layer 90 in those areas where the metal is in contact with silicon. The remainder of the metal, e.g., over oxide isolation 40 and oxide spacers 88 and 88a, is then etched away.

The structure is now planarized by applying a layer 92 of doped glass, e.g., a phosphorus-silica or boron-phosphorus-silica, and a photoresist layer 94. Layers 92 and 94 are then plasma etched to planarize the surface. The use of a doped glass is preferred for planarization because of the more rapid etch rate of doped glass. The doped glass and photoresist material are preferably selected to etch at about the same rate and at a faster rate than any remaining portions of the underlying oxide layer 86. The planarization may also be done by mechanical polishing to obtain a flat surface.

The planarized surface is then isotropically etched to remove about 2000 Angstroms of glass to open a contacts to emitter region 62 and collector contact region 64, i.e., expose the metal silicide 82 over emitter region 62 and collector contact region 64. Emitter 62 and collector 64 are then masked, and the glass is further etched to open the base contact. It will be noted that the amount of etching needed to open the emitter and collector contacts will depend on the height of emitter region 62 and collector contact region 64, i.e., the thickness of polysilicon layer 60, as well as the thickness of doped glass layer 92.

Figure 6:
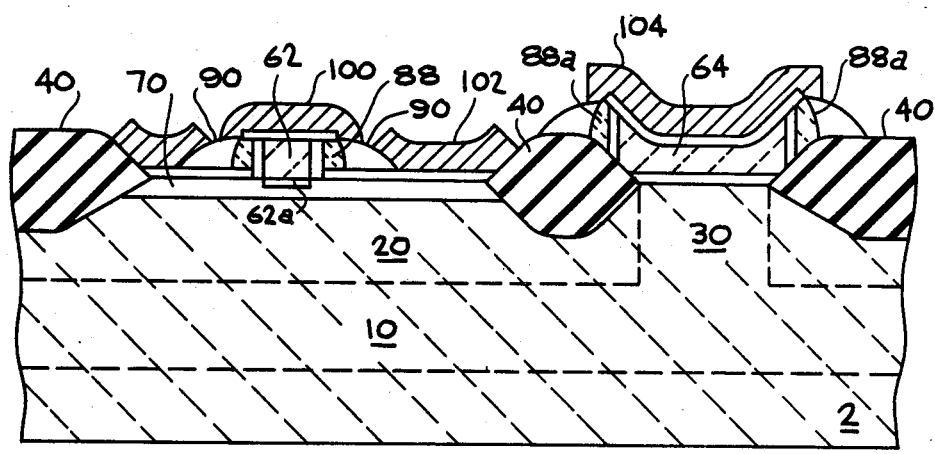
FIG. 6 is a fragmentary vertical cross-sectional view illustrating the improved bipolar device of the invention after completion of construction.

Finally, as shown in FIG. 6, the structure is metallized and then masked and etched to provide the emitter, base, and collector metal contacts respectively, at 100, 102, and 104.

The resulting bipolar transistor structure operates faster due to the low resistance between the intrinsic base and the base contact with high base resistance only under the emitter and oxide spacers since the remainder of the base is in contact with the metal silicide, thus effectively eliminating the relatively high resistance and high collector-base capacitance of the extrinsic base regions of prior art devices. The use of polysilicon emitters also results in a device having higher gain by preventing reverse injection of minority carriers from the base to the emitter.

The elimination of the extrinsic base layer, as well as the provision of a shallow emitter, permits thinning of the epitaxial layer which permits vertical shrinkage of the device. Normally the extrinsic base region is about 6500 to 7500 angstroms deep from the original silicon surface. Since during processing, the buried collector layer comes up by about 5500 angstroms, the prior art epi layer must be at least 13,500 angstroms thick to still provide sufficient spacing between the extrinsic base and the buried collector to avoid reducing the breakdown voltage and increasing the capacitance. Since the intrinsic base region is normally only about 2000 angstroms deep and the shallow emitter formed in the intrinsic base is less than 1000 angstroms, the epi layer above the buried collector may be thinned to about 7000 to 10,000 angstroms which, in turn, allows vertical shrinking of the structure without increasing the collector-base capacitance.

The elimination of an extrinsic base region also permits horizontal shrinkage by elimination of the horizontal diffusion of the extrinsic base region which, in the prior art, reduced the effective area of the emitter thus necessitating masking for a larger initial emitter area to compensate for such loss of emitter area. Shrinkage of the emitter area lowers the emitter-base capacitance thus increasing the speed of the device. Furthermore, by eliminating the extrinsic base diffusion, the current carrying capacity for the same physical emitter size is increased.

The horizontal distance of the device is also shrunk since only the width of the oxide spacer separates the base contact from the emitter. This use of an oxide spacer is made possible by the use of the raised polysilicon emitter. The provision of the oxide spacer, in turn, makes it possible to form the metal silicide base contact close to the emitter. Finally, the use of planarization techniques as well as the presence of the spacer oxide makes it possible to open the contact to the emitter without simultaneously opening the metal silicide base contact,, i.e., without shorting out the device.

Figure 7:
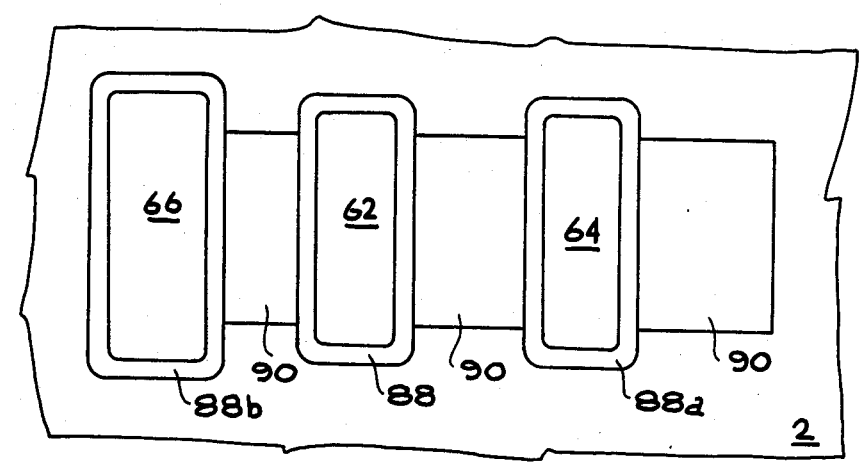
FIG. 7 is a fragmentary top view of another embodiment of the invention at one stage of construction.

Turning now to FIG. 7, another embodiment of the invention is illustrated. In this embodiment, a base contact 66 is also defined in polysilicon layer 60 during the masking and etching to form raised emitter region 62 and collector contact region 64. In this embodiment, the deposition of oxide layer 86 and its subsequent removal by a reactive ion etch leaves oxide spacers 88b around polysilicon base contact 66 which must be removed prior to formation of the silicide.

Figure 8:
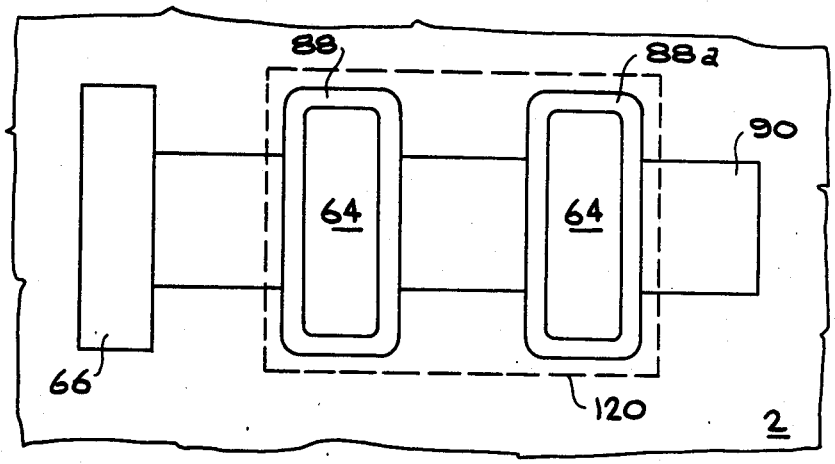
FIG. 8 is a fragmentary top view of the embodiment of FIG. 7 at a later stage of construction.

An oversized mask 120, shown in dotted lines in FIG. 8, may be put over emitter region 62 and spacers 88, and collector region 64 and spacers 88a to permit removal of oxide spacers 88b around raised polysilicon base contact 66. Subsequent application of the previously described silicide step will then provide a conductive path to base contact 66.

While this embodiment provides for an additional masking step to protect the respective oxide spacers 88 and 88a on the sides of raised emitter 62 and collector contact 64 during removal of oxide spacers 88b, the subsequent planarization step, as previously described to open the emitter and collector contacts, can also be used to open the base contact as well. This eliminates the additional masking step needed to protect oxide spacers 88 and 88a during opening of the base contact in the previously described embodiment. The real advantage of this embodiment, however, lies in the planarization which results from forming all of the contacts in approximately the same plane by the raising of the base contact.

Thus, an improved bipolar integrated circuit device is provided characterized by higher gain, increased speed, and decreased size in both the horizontal and vertical directions. The provision of oxide spacers adjacent a raised emitter region permits elimination of the extrinsic base region and replacement by a conductive path from the spacer to the base contact. The use of a raised base contact region permits enhanced planarization of the contact regions of the device.

Having thus described the invention, what is claimed is:

1. A method for making an improved vertical bipolar transistor for an integrated circuit structure characterized by improved gain and higher speed while permitting size reduction in both horizontal and vertical directions by the formation of a shallow emitter region and the substantial elimination of an extrinsic base region comprising:
   (a) forming an integrated circuit structure having a doped buried collector layer in a silicon substrate with an epitaxial layer formed thereon over said buried layer and isolation oxide portions formed in said substrate to separate said vertical bipolar transistor from adjacent active devices as well as to separate the collector region from the emitter/base regions;
   (b) forming an intrinsic base region in said epitaxial layer;
   (c) forming a layer of doped polysilicon over said structure;
   (d) masking said polysilicon to define at least an emitter region and removing the remainder of said polysilicon to leave a raised polysilicon emitter contact portion;
   (e) forming an oxide layer over said structure and, at the same time, forming a shallow emitter region in said structure by the following steps:
      (1) growing a thin oxide protective coating over said silicon by heating the silicon to temperature and for a time period sufficient to diffuse dopant from said raised polysilicon emitter contact portion into said intrinsic base region in said epitaxial layer of said substrate to form a shallow emitter region having a depth of less that 1000 Å; and
      (2) depositing sufficient additional oxide over said thin protective coating to provide a total oxide layer having a thickness of about 2500–5000 Å; whereby said additional thickness of oxide does not result in further diffusion of said emitter region into said structure;
   (f) removing portions of said oxide layer by reactive ion etching to leave oxide spacers portions on the sidewalls of said raised polysilicon emitter contact portion;
   (g) forming a metal silicide contact for said intrinsic base region on said portion of said epitaxial layer exposed by removal of said oxide layer;
   (h) forming an insulation layer over said structure;
   (i) planarizing said insulation layer to expose said raised polysilicon emitter contact portion; and
   (j) forming the remaining contacts to said bipolar transistor through said insulating layer;
whereby the provision of a shallow emitter region in said structure and the substantial elimination of an extrinsic base region by said metal silicide base contact permits the vertical dimension of said transistor to be reduced and the elimination of diffusion from an extrinsic base region into said emitter region and the provision of said oxide spacers between said raised polysilicon emitter contact portion and said metal silicide permit the horizontal dimension of said transistor to be reduced.

2. The process of claim 1 wherein said step of forming said intrinsic base region is performed after deposition of said doped polysilicon layer by masking said polysilicon layer and then implanting said epitaxial layer with a P+ boron implantation through the unmasked portion of said polysilicon layer.

3. The process of claim 1 wherein said polysilicon layer is doped with an N type dopant selected from the class consisting of arsenic, phosphorus, and antimony to form an N+ layer.

4. The method of claim 1 wherein said step of masking said doped polysilicon to define a raised polysilicon emitter contact portion further comprises defining a raised polysilicon collector contact portion; said step of removing portions of said oxide layer by reactive ion etching to leave oxide spacers portions on the sidewalls of said raised polysilicon emitter contact portion further comprises leaving oxide spacers on the sidewalls of said raised polysilicon collector contact portion; and said step of planarizing said insulation layer to expose said raised polysilicon emitter contact portion further comprises exposing said raised polysilicon collector contact portion.

5. The method of claim 1 wherein said removal of said oxide layer by reactive ion etching leaves an oxide spacer on the sidewall of said raised polysilicon emitter contact portion having a thickness of from about 2500–5000 Å.

6. The method of claim 1 wherein said step of masking said doped polysilicon to define a raised polysilicon emitter contact portion further comprises defining a raised polysilicon collector contact portion and a raised polysilicon base contact portion; said step of removing portions of said oxide layer by reactive ion etching to leave oxide spacers portions on the sidewalls of said raised polysilicon emitter contact portion further comprises leaving oxide spacers on the sidewalls of said raised polysilicon collector contact portion and said raised polysilicon base contact portion; said method further includes removing said oxide spacers on said sidewall of said raised polysilicon base contact portion prior to said step of forming said metal silicide whereby said step of forming said metal silicide on said exposed epitaxial layer further includes forming metal silicide on the exposed polysilicon sidewalls of said raised polysilicon base contact portion; and said step of planarizing said insulation layer to expose said raised polysilicon emitter contact portion further comprises exposing said raised polysilicon collector and base contact portions to provide a highly planarized structure.

7. The method of claim 1 wherein said step of growing said thin oxide protective coating and diffusing said shallow emitter region further comprises heating said structure to a temperature of about 900° C. for about 20 minutes.

* * * * *